United States Patent
Lee et al.

(10) Patent No.: US 12,236,853 B2
(45) Date of Patent: Feb. 25, 2025

(54) PIXEL AND DISPLAY DEVICE INCLUDING THE SAME

(71) Applicant: Samsung Display Co., LTD., Yongin-si (KR)

(72) Inventors: Won Jun Lee, Yongin-si (KR); Yong Bin Kim, Yongin-si (KR); Chol Ho Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/457,897

(22) Filed: Aug. 29, 2023

(65) Prior Publication Data

US 2024/0135868 A1 Apr. 25, 2024
US 2024/0233623 A9 Jul. 11, 2024

(30) Foreign Application Priority Data

Oct. 25, 2022 (KR) .................... 10-2022-0138629

(51) Int. Cl.
G09G 5/10 (2006.01)
G09G 3/20 (2006.01)
G09G 3/32 (2016.01)
H01L 25/16 (2023.01)

(52) U.S. Cl.
CPC ............. *G09G 3/32* (2013.01); *G09G 3/2007* (2013.01); *H01L 25/167* (2013.01)

(58) Field of Classification Search
CPC ....... G09G 3/32; G09G 3/2007; H01L 25/167
USPC ...................................................... 345/691
See application file for complete search history.

(56) References Cited

U.S. PATENT DOCUMENTS

| 6,069,597 | A | 5/2000 | Hansen |
| 9,886,900 | B2 | 2/2018 | Hwang et al. |
| 10,388,205 | B2 | 8/2019 | Cok et al. |
| 2009/0109149 | A1* | 4/2009 | Akimoto ............. G09G 3/3233 345/76 |
| 2018/0301080 | A1* | 10/2018 | Shigeta .................. G09G 3/32 |
| 2021/0312856 | A1* | 10/2021 | Jeong .................... G09G 3/32 |
| 2022/0068203 | A1* | 3/2022 | Lee ..................... G09G 3/3291 |
| 2022/0358878 | A1* | 11/2022 | Kim ..................... G09G 3/3225 |

FOREIGN PATENT DOCUMENTS

| KR | 10-2016-0054140 A | 5/2016 |
| KR | 10-1726627 B1 | 4/2017 |
| KR | 10-2020-0069148 A | 6/2020 |

* cited by examiner

*Primary Examiner* — Jennifer T Nguyen
(74) *Attorney, Agent, or Firm* — Womble Bond Dickinson (US) LLP

(57) ABSTRACT

A pixel includes a first transistor generating current from a first power source line to a second power source line through a light-emitting element, a second transistor between a third power source line and a gate electrode of the first transistor, a third transistor between a data line and a gate electrode of the second transistor and controlled by a first signal, a fourth transistor between a fourth power source line and a first node and controlled by a second signal, a first capacitor between the gate electrode of the first transistor and the first node, and a second capacitor between the gate electrode of the second transistor and a sweep voltage line providing a sweep voltage that linearly changes from a first voltage level to a second voltage level, and nonlinearly changes from the second voltage level to a third voltage level when the third transistor is on.

20 Claims, 10 Drawing Sheets

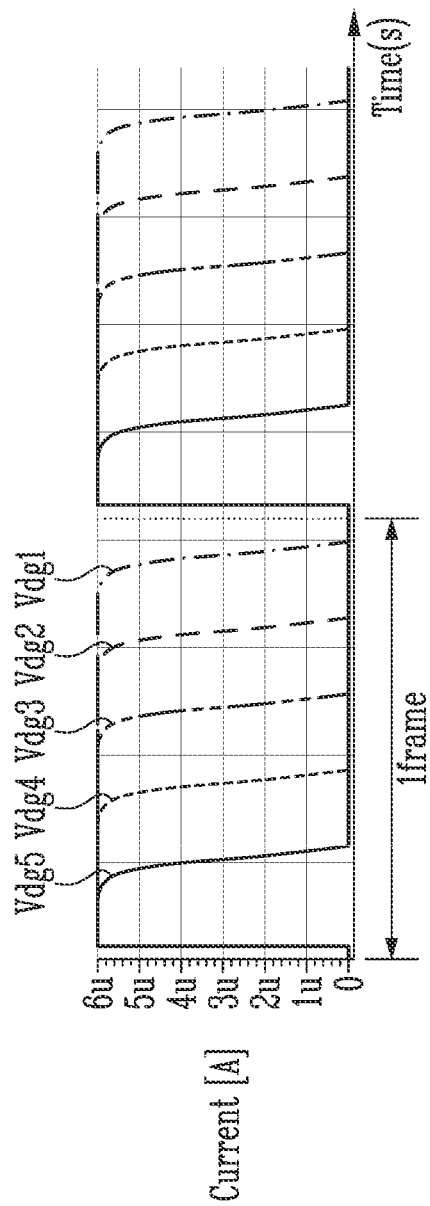

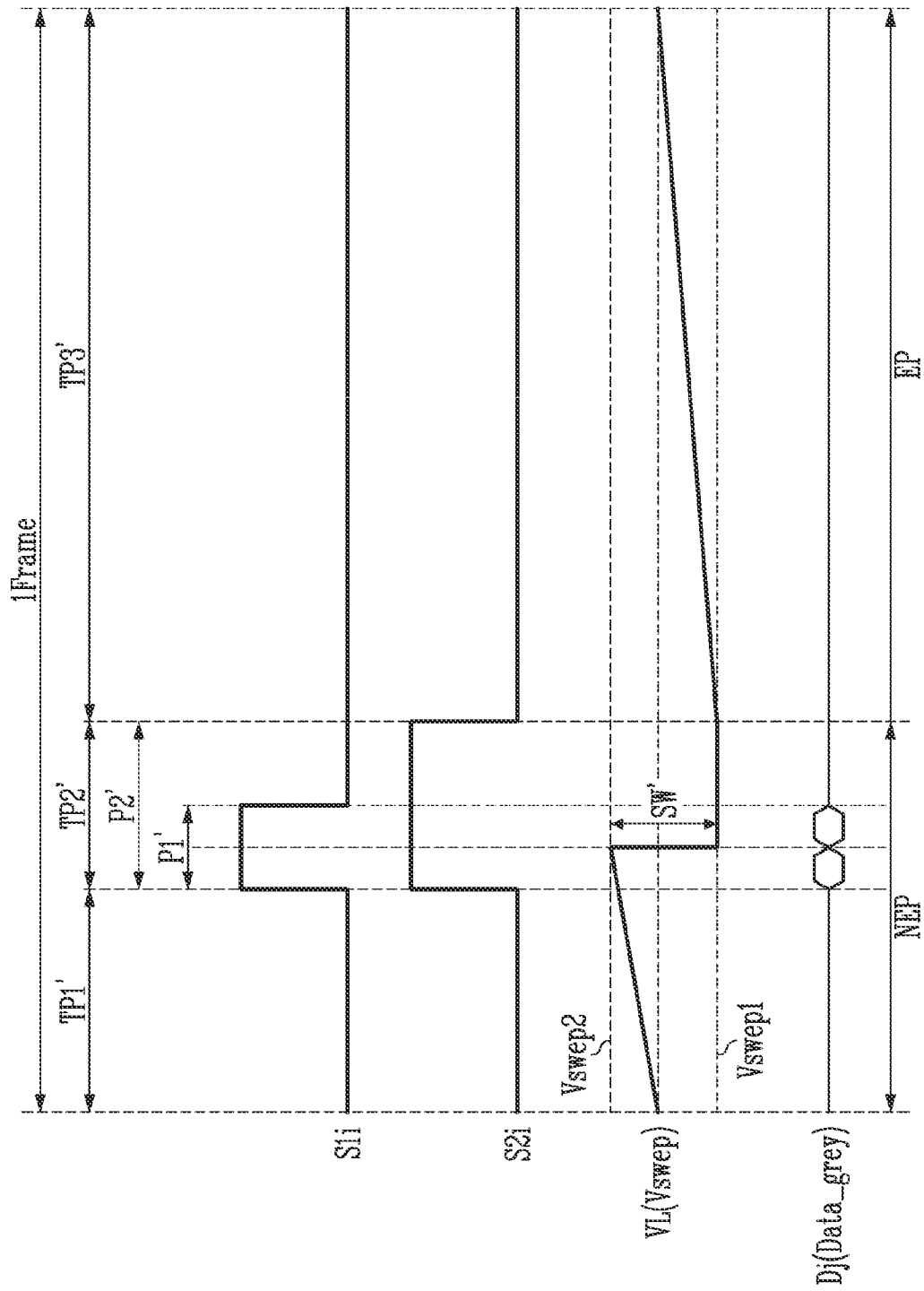

PIXEL AND DISPLAY DEVICE INCLUDING THE SAME

CROSS-REFERENCE TO RELATED APPLICATION

The application claims priority to, and the benefit of, Korean Patent Application No. 10-2022-0138629, filed Oct. 25, 2022, in the Korean Intellectual Property Office, which is hereby incorporated by reference for all purposes as if fully set forth herein.

BACKGROUND

1. Field

The present disclosure relates to a pixel, and a display device including the same.

2. Description of Related Art

In recent years, as interest in information displays increases, research and development on display devices are continuously being made.

SUMMARY

An aspect of the present disclosure provides a pixel capable of reducing or preventing degradation of display quality due to a color shift phenomenon caused by material characteristics of a light-emitting element, and capable of increasing resolution by reducing an area.

Another aspect of the present disclosure provides a display device including the pixel.

However, the present disclosure are not limited to the above-described aspects, and the disclosed embodiments may be variously extended without departing from the spirit and scope of the present disclosure.

A pixel according to embodiments of the present disclosure may include a light-emitting element, a first transistor connected between a first power source line, which is configured to provide a first power source voltage, and a first node, and configured to generate a drive current flowing from the first power source line to a second power source line, which is configured to provide a second power source voltage, through the light-emitting element, a second transistor connected between a third power source line, which is configured to provide a reference voltage, and a gate electrode of the first transistor, a third transistor connected between a data line, which is configured to provide a grayscale voltage, and a gate electrode of the second transistor, and configured to be turned on in response to a first scan signal, a fourth transistor connected between a fourth power source line, which is configured to provide a sensing voltage, and the first node, and configured to be turned on in response to a second scan signal, a first capacitor between the gate electrode of the first transistor and the first node, and a second capacitor between the gate electrode of the second transistor and a sweep voltage line, which is configured to provide a sweep voltage that linearly changes from a first voltage level to a second voltage level in response to a control signal, and that nonlinearly changes from the second voltage level to a third voltage level during a period in which the third transistor is turned on.

The third voltage level may be between the first voltage level and the second voltage level.

An emission time of the light-emitting element may correspond to the grayscale voltage and the third voltage level.

The emission time of the light-emitting element may increase as a level of the grayscale voltage decreases.

The emission time of the light-emitting element may increase as the third voltage level decreases.

The sweep voltage line may be configured to provide the sweep voltage that nonlinearly changes to the first voltage level from the third voltage level during a period in which the fourth transistor is turned on.

The sweep voltage line may be configured to provide the sweep voltage that nonlinearly changes to the first voltage level from the third voltage level during a period in which the third transistor is turned off.

One frame period may include a first period during which the first scan signal is supplied to the third transistor, and the grayscale voltage supplied to the data line is written to a second node connected to the gate electrode of the second transistor, and a second period during which the second scan signal is supplied to the fourth transistor, and the sensing voltage supplied to the fourth power source line is written to the first node, wherein the second period at least partially overlaps the first period.

During the first period, the third transistor may be configured to be turned on, and the reference voltage supplied to the third power source line may be configured to be written to a third node connected to the gate electrode of the first transistor.

The second period may be twice as long in duration as the first period.

The one frame period may further include a third period for providing the sweep voltage that linearly changes from the first voltage level to the second voltage level.

The second transistor and the third transistor may be configured to be turned off during the third period.

The first node may be configured to be electrically connected to the second power source line.

The light-emitting element may be configured to emit green light.

A display device according to embodiments of the present disclosure may include a pixel connected to a first scan line and a second scan line, a data line, and a sweep voltage line, a scan driver configured to supply a first scan signal and a second scan signal to the first scan line and the second scan line, respectively, and a data driver configured to supply a data grayscale signal to the data line, wherein the pixel includes a first transistor connected between a first power source line, which is configured to provide a first power source voltage, and a first node, and configured to generate a drive current flowing from the first power source line to a second power source line, which is configured to provide a second power source voltage, through a light-emitting element, a second transistor connected between a third power source line, which is configured to provide a reference voltage, and a gate electrode of the first transistor, a third transistor connected between the data line and a gate electrode of the second transistor, and configured to be turned on in response to the first scan signal, a fourth transistor connected between a fourth power source line, which is configured to provide a sensing voltage, and the first node, and configured to be turned on in response to the second scan signal, a first capacitor between the gate electrode of the first transistor and the first node, and a second capacitor between the gate electrode of the second transistor and the sweep voltage line, which is configured to provide a sweep voltage that linearly changes from a first voltage level to a second voltage level in response to a control signal, and that nonlinearly decreases from the second voltage level to a third voltage level during a period in which the third transistor is turned on.

The third voltage level may be between the first voltage level and the second voltage level.

One frame period may include a first period during which the first scan signal is supplied to the third transistor, and a grayscale voltage supplied to the data line is written to a second node connected to the gate electrode of the second transistor, and a second period at least partially overlaps the first period, and during which the second scan signal is supplied to the fourth transistor, and the sensing voltage supplied to the fourth power source line is written to the first node.

During the first period, the third transistor may be turned on, and the reference voltage supplied to the third power source line may be written to a third node connected to the gate electrode of the first transistor.

During a period in which the third transistor is turned off and the fourth transistor is turned on, the sweep voltage line may provide the sweep voltage that nonlinearly decreases from the third voltage level to the first voltage level.

The one frame period may further include a third period for providing the sweep voltage that linearly changes from the first voltage level to the second voltage level, and during which the second transistor and the third transistor are turned off.

BRIEF DESCRIPTION OF THE DRAWINGS

The accompanying drawings, which are included to provide a further understanding of the present disclosure, and are incorporated in and constitute a part of this specification, illustrate embodiments of the present disclosure, and, together with the description, serve to explain aspects of the present disclosure.

FIGS. 6A and 6B are diagrams illustrating an emission period of the light-emitting element according to a grayscale voltage of FIG. 4.

FIG. 8 is a timing diagram illustrating an example of signals supplied to the pixel of FIG. 4 during one frame.

DETAILED DESCRIPTION

Figure 1:
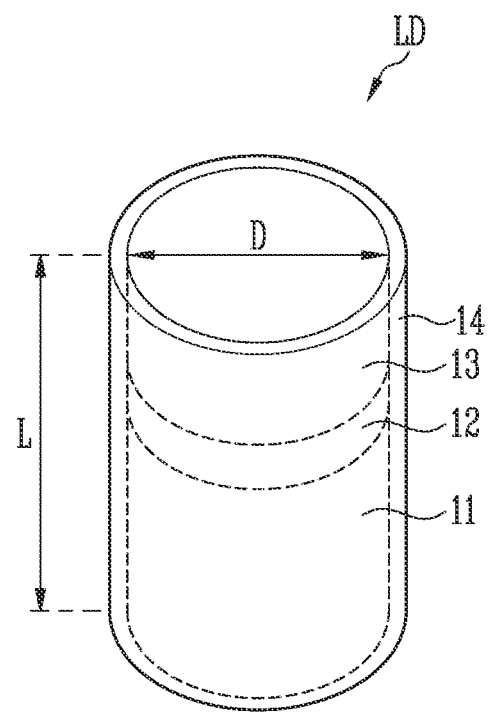
FIG. 1 is a perspective view schematically illustrating a light-emitting element according to embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein.

Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
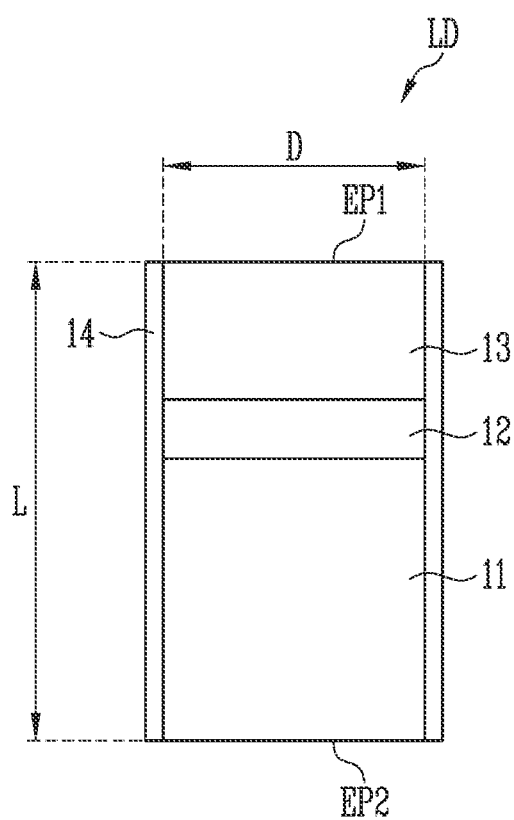
FIG. 2 is a cross-sectional view illustrating an example of the light-emitting element of FIG. 1.

FIG. 1 is a perspective view schematically illustrating a light-emitting element according to embodiments of the present disclosure. FIG. 2 is a cross-sectional view illustrating an example of the light-emitting element of FIG. 1.

Referring to FIGS. 1 and 2, a light-emitting element LD may include a first semiconductor layer 11, a second semiconductor layer 13, and an active layer 12 interposed between the first and second semiconductor layers 11 and 13. For example, the light-emitting element LD may be implemented as a light-emitting laminate (or laminated pattern) in which the first semiconductor layer 11, the active layer 12, and the second semiconductor layer 13 are sequentially stacked.

In one or more embodiments, the light-emitting element LD may be provided in a shape extending in one direction. When an extension direction of the light-emitting element LD is referred to as a longitudinal direction, the light-emitting element LD may include a first end EP1 and a second end EP2 along the longitudinal direction. One of the first semiconductor layer 11 and the second semiconductor layer 13 may be positioned at the first end EP1 of the light-emitting element LD. The other of the first semiconductor layer 11 and the second semiconductor layer 13 may be positioned at the second end EP2 of the light-emitting element LD.

In one or more embodiments, the light-emitting element LD may be provided in various shapes. As an example, as shown in FIG. 1, the light-emitting element LD may have a rod-like shape, a bar-like shape, or a columnar shape that is long in the longitudinal direction (e.g., with an aspect ratio greater than 1). As another example, the light-emitting element LD may have a rod-like shape, a bar-like shape, or a columnar shape that is short in the longitudinal direction (or with an aspect ratio less than 1). As another example, the light-emitting element LD may have a rod-like shape, a bar-like shape, or a columnar shape having an aspect ratio of 1.

For example, the light-emitting element LD may include a light-emitting diode (LED) manufactured in an ultra-small size to have a diameter D and/or a length L of a nanoscale (or nanometer) to a microscale (or micrometer).

In one or more embodiments, when the light-emitting element LD is long in the longitudinal direction (that is, has an aspect ratio greater than 1), the diameter D of the light-emitting element LD may be about 0.5 μm to about 6 μm, and the length L of the light-emitting element LD may be about 1 μm to about 10 μm. However, the diameter D and length L of the light-emitting element LD are not limited thereto. The size of the light-emitting element LD may be changed to meet design conditions of a lighting device or a self-light-emitting display device to which the light-emitting element LD is applied.

In one or more embodiments, the first semiconductor layer 11 may include, for example, at least one n-type semiconductor layer. Along the longitudinal direction of the light-emitting element LD, the first semiconductor layer 11 may include an upper surface in contact with the active layer 12, and a lower surface exposed to outside. The lower surface of the first semiconductor layer 11 may be one end (or lower end) of the light-emitting element LD.

In one or more embodiments, the active layer 12 may be located on the first semiconductor layer 11, and may be formed in a single or multiple quantum well structure. As an example, when the active layer 12 is formed of a multiple quantum well structure, the active layer 12 may have a structure in which a barrier layer, a strain reinforcing layer, and a well layer are periodically and repeatedly stacked as one unit. Because the strain reinforcing layer has a smaller lattice constant than the barrier layer, strain applied to the well layer, for example, compressive strain, may be further strengthened. However, the structure of the active layer 12 is not limited to the above-described embodiments.

In one or more embodiments, the active layer 12 may emit light having a wavelength of about 400 nm to about 900 nm, and a double hetero structure may be used. The active layer 12 may include a first surface in contact with the first semiconductor layer 11 and a second surface in contact with the second semiconductor layer 13.

In one or more embodiments, the color (or emission color) of the light-emitting element LD may be determined according to the wavelength of light emitted from the active layer 12. The color of the light-emitting element LD may determine the color of a corresponding pixel. For example, the light-emitting element LD may emit red light, green light, or blue light.

In one or more embodiments, when an electric field of a voltage (e.g., predetermined voltage) or higher is applied to or across ends of the light-emitting element LD, the light-emitting element LD may emit light while electron-hole pairs are coupled in the active layer 12. By controlling the light-emitting from the light-emitting element LD using this principle, the light-emitting element LD may be used as a light source (or light-emitting source) of various light-emitting devices including pixels of a display device.

In one or more embodiments, the second semiconductor layer 13 may be located on the second surface of the active layer 12, and may include a semiconductor layer of a different type from the first semiconductor layer 11. As an example, the second semiconductor layer 13 may include at least one p-type semiconductor layer.

In one or more embodiments, along the longitudinal direction of the light-emitting element LD, the second semiconductor layer 13 may include a lower surface in contact with the second surface of the active layer 12 and an upper surface exposed to the outside. Here, the upper surface of the second semiconductor layer 13 may be the other end (or upper end) of the light-emitting element LD.

In one or more embodiments, the first semiconductor layer 11 and the second semiconductor layer 13 may have different respective thicknesses in the longitudinal direction of the light-emitting element LD. As an example, the first semiconductor layer 11 may have a relatively greater thickness than the second semiconductor layer 13 along the longitudinal direction of the light-emitting element LD. Accordingly, the active layer 12 of the light-emitting element LD may be positioned to be closer to the upper surface of the second semiconductor layer 13 than to the lower surface of the first semiconductor layer 11.

Each of the first semiconductor layer 11 and the second semiconductor layer 13 is composed of one respective layer is shown, but the present disclosure is not limited thereto. In one example, depending on the material of the active layer 12, each of the first semiconductor layer 11 and the second semiconductor layer 13 may further include at least one or more layers, for example, a cladding layer and/or a tensile strain barrier reducing (TSBR) layer. The TSBR layer may be a strain relief layer located between semiconductor layers having different lattice structures and serving as a buffer to reduce a difference in lattice constant. The TSBR layer may be composed of a p-type semiconductor layer such as p-GaInP, p-AlInP, p-AlGaInP, or the like, but the present disclosure is not limited thereto.

In one or more embodiments, in addition to the above-described first semiconductor layer 11, active layer 12, and second semiconductor layer 13, the light-emitting element LD may further include a contact electrode (hereinafter referred to as a "first contact electrode") located on the second semiconductor layer 13. In addition, according to one or more other embodiments, another contact electrode (hereinafter referred to as a "second contact electrode") located on one end of the first semiconductor layer 11 may be further included.

In one or more embodiments, each of the first and second contact electrodes may be an ohmic contact electrode, but the present disclosure is not limited thereto. According to one or more embodiments, the first and second contact electrodes may be Schottky contact electrodes. The first and second contact electrodes may include a conductive material.

In one or more embodiments, the light-emitting element LD may further include an insulating film 14 (or an insulating thin film). However, according to one or more embodiments, the insulating film 14 may be omitted or may be provided to cover only a portion of the first semiconductor layer 11, the active layer 12, and the second semiconductor layer 13.

In one or more embodiments, the insulating film 14 may reduce or prevent the likelihood of an electrical short circuit that may occur when the active layer 12 contacts a conductive material other than the first and second semiconductor layers 11 and 13. In addition, the insulating film 14 may reduce or minimize surface defects of the light-emitting element LD to improve the lifespan and light-emitting efficiency of the light-emitting element LD. The insulating film 14 need not be provided, as long as the active layer 12 can avoid being short-circuited with an external conductive material.

In one or more embodiments, the insulating film 14 may surround at least a portion of an outer circumferential surface of the light-emitting laminate including the first semiconductor layer 11, the active layer 12, and the second semiconductor layer 13.

In the above-described embodiments, the form in which the insulating film 14 entirely surrounds the outer circumferential surface of each of the first semiconductor layer 11, the active layer 12, and the second semiconductor layer 13 has been described, but the present disclosure is limited thereto.

In one or more embodiments, the insulating film 14 may include a transparent insulating material. For example, the insulating film 14 may include at least one insulating material selected from the group consisting of silicon oxide (SiOx), silicon nitride (SiNx), silicon oxynitride (SiOxNy), aluminum oxide (AlOx), titanium oxide (TiOx), hafnium oxide (HfOx), titanium strontium oxide (SrTiOx), cobalt oxide (CoxOy), magnesium oxide (MgO), zinc oxide (ZnOx), ruthenium oxide (RuOx), nickel oxide (NiO), tungsten oxide (WOx), tantalum oxide (TaOx), gadolinium oxide (GdOx), zirconium oxide (ZrOx), gallium oxide (GaOx), vanadium oxide (VxOy), ZnO:Al, ZnO:B, InxOy:H, niobium oxide (NbxOy), magnesium fluoride (MgFx), aluminum fluoride (AlFx), alucone polymer film, titanium nitride (TiN), tantalum nitride (TaN), aluminum nitride (AlNx), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the present disclosure is not limited thereto, and various materials having insulating properties may be used as the material of the insulating film 14.

In one or more embodiments, the insulating film 14 may be provided in the form of a single layer or in the form of multiple layers including a double layer.

The light-emitting element LD described above may be used as a light-emitting source (or light source) of various display devices. The light-emitting element LD may be manufactured through a surface treatment process. For example, when a plurality of light-emitting elements LD are mixed in a liquid solution (or solvent) and supplied to each pixel area (for example, an emission area of each pixel or an emission area of each sub-pixel), each of the light-emitting elements LD may be surface-treated so that the light-emitting elements LD may be uniformly sprayed without uneven aggregation in the solution.

A light-emitting unit (or light-emitting device) including the light-emitting element LD described above may be used in various types of electronic devices using a suitable light source, including display devices. For example, when a plurality of light-emitting elements LD are located in a pixel area of each pixel of a display panel, the light-emitting elements LD may be used as a light source of each pixel. However, the field to which the light-emitting element LD is applied is not limited to the above-described example. For example, the light-emitting element LD may also be used in other types of electronic devices using a suitable light source, such as a lighting device.

However, this is only an example, and the light-emitting element LD applied to a display device according to embodiments of the present disclosure is not limited thereto. For example, the light-emitting element may be a flip chip type micro light-emitting diode or an organic light-emitting element including an organic light-emitting layer.

Figure 3:
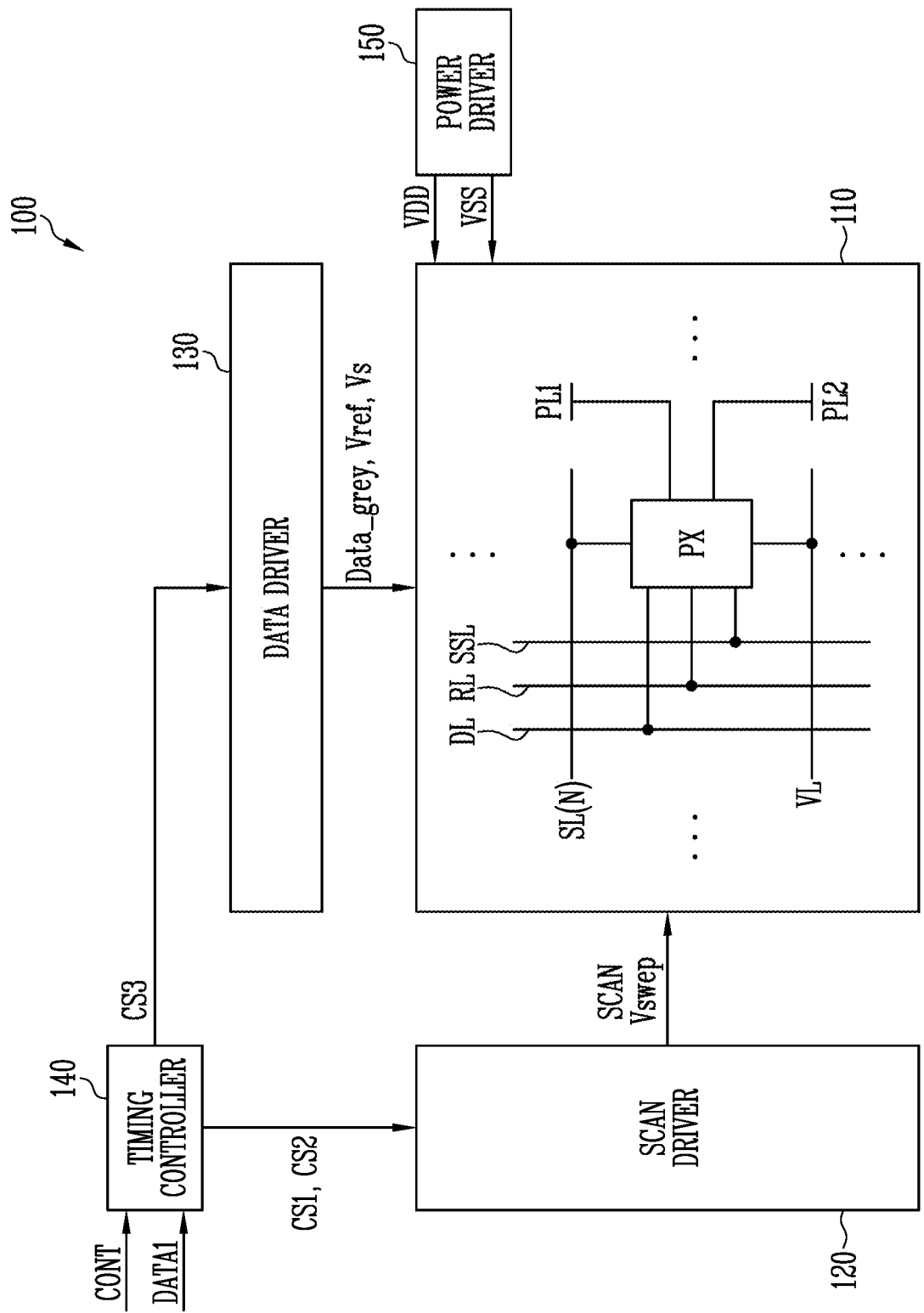
FIG. 3 is a block diagram illustrating a display device.

FIG. 3 is a block diagram illustrating a display device.

Referring to FIG. 3, a display device 100 according to embodiments of the present disclosure may include a display 110, a scan driver 120, a data driver 130, a timing controller 140, and a power driver 150.

In one or more embodiments, the display 110 may include pixels PX. Although only one pixel PX is shown in FIG. 3, a plurality of pixels PX may be located on the display 110. For example, the pixels PX may be arranged in a matrix form including a plurality of pixel rows extending in a row direction and a plurality of pixel columns extending in a column direction.

In one or more embodiments, the display 110 may display an image corresponding to one frame of image data by receiving a grayscale voltage Data_grey for each frame time period and emitting light by a driving current having a pulse width corresponding to the grayscale voltage Data_grey.

In one or more embodiments, each pixel PX may be connected to a scan line SL(N) and a sweep voltage line VL extending in the row direction, and may be connected to a data line DL, a reference voltage line RL, and a sensing line SSL extending in the column direction. The pixel PX may be connected to first and second power source lines PL1 and PL2.

In one or more embodiments, the scan line SL(N) may include a plurality of scan lines. In one example, the scan line SL(N) and the sweep voltage line VL may extend in the row direction and may be connected to the scan driver 120.

In one or more embodiments, the data line DL, the sensing line SSL, and the reference voltage line RL may extend in the column direction, and may be connected to the data driver 130.

In one or more embodiments, the first power source line PL1 and the second power source line PL2 may be connected to the power driver 150.

The reference voltage line RL and the sensing line SSL may be connected to the data driver 130, but in one or more embodiments, the reference voltage line RL and the sensing line SSL may be connected to the power driver 150.

Hereinafter, the scan line SL(N), the sweep voltage line VL, the data line DL, the reference voltage line RL, the sensing line SSL, and the first and second power source lines PL1 and PL2 connected to the pixel PX will be mainly explained.

In one or more embodiments, the pixel PX may include a light-emitting element (for example, the light-emitting element LD of FIG. 1) and a pixel circuit that outputs the driving current to the light-emitting element. The light-emitting element may be an inorganic light-emitting diode (LED) manufactured using an inorganic material. The light-emitting element may be a micro LED having a size of less than a micrometer (μm). The light-emitting element may be an LED capable of emitting light of a specific color such as a red LED, a green LED, and a blue LED.

In one or more embodiments, the scan driver 120 may generate a plurality of scan signals based on a first control signal CS1 provided from the timing controller 140. The scan driver 120 may sequentially generate the plurality of scan signals. The generated scan signals may be provided to the pixels PX through the scan line SL(N). The pixel PX may receive a plurality of scan signals SCAN through the scan line SL(N). The plurality of scan signals SCAN may include a first scan signal and a second scan signal.

In one or more embodiments, each of the first scan signal and the second scan signal may be set to a voltage having a gate-on level corresponding to the type of transistor to which a corresponding scan signal is supplied. A transistor receiving the scan signal may be set to a turned-on state when the scan signal is supplied. For example, the gate-on level of the scan signal supplied to a P-channel metal oxide semiconductor (PMOS) transistor may be a logic low level, and the gate-on level of the scan signal supplied to an N-channel metal oxide semiconductor (NMOS) transistor may be a logic high level. Hereinafter, the expression "a scan signal is supplied" may mean that a scan signal is supplied at a logic level at which a transistor controlled by the scan signal can be turned on.

In one or more embodiments, the scan driver 120 may generate a sweep voltage Vswep based on a second control signal CS2 provided from the timing controller 140. The scan driver 120 may generate the sweep voltage Vswep that changes linearly during a period (e.g., predetermined period), and may provide the generated sweep voltage Vswep to the pixel PX through the sweep voltage line VL. In addition, the scan driver 120 may generate the sweep voltage Vswep having a magnitude that decreases nonlinearly at least twice or more during a period other than the period (e.g., predetermined period), and may provide the generated sweep voltage Vswep to the pixel PX through the sweep voltage line VL.

In one or more embodiments, the data driver 130 may generate the grayscale voltage Data_grey, a reference voltage Vref, and a sensing voltage Vs based on a third control signal CS3 provided from the timing controller 140. The data driver 130 may output the generated grayscale voltage Data_grey to the data line DL. The data driver 130 may output the generated reference voltage Vref to the reference voltage line RL. The data driver 130 may output the generated sensing voltage Vs to the sensing line SSL.

In one or more embodiments, the power driver 150 may generate a first power source voltage VDD and a second power source voltage VSS to drive the display 110. In one example, the first power source voltage VDD may be provided to the first power source line PL1, and the second power source voltage VSS may be provided to the second power source line PL2. A voltage level of the first power source voltage VDD may be higher than that of the second power source voltage VSS. For example, the first power source voltage VDD may be about 8V and the second power source voltage VSS may be about 0V.

In one or more embodiments, the timing controller 140 may control the display 110 by controlling the scan driver 120, the data driver 130, and the power driver 150. The timing controller 140 may receive a control signal CONT and image data DATA1 from an external device. The timing controller 140 may generate the first, second, and third control signals CS1, CS2, and CS3 using the control signal CONT.

In one or more embodiments, the display device 100 may output light of various wavelengths through various light-emitting elements. In one example, when the light-emitting element of the display device 100 is a light-emitting element for emitting green light, image quality may be degraded due to a color shift phenomenon caused by material characteristics of the light-emitting element. In one example, the color shift phenomenon can be reduced or prevented by constantly controlling the driving current based on the reference voltage Vref and the sensing voltage Vs to improve the display quality of an image.

Figure 4:
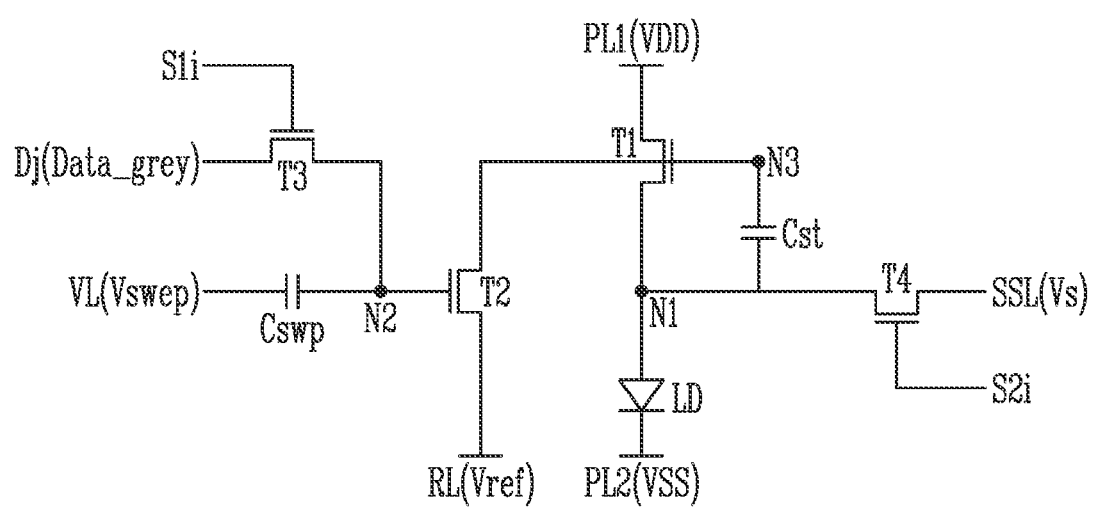
FIG. 4 is a circuit diagram illustrating an example of a pixel included in the display device of FIG. 3.

FIG. 4 is a circuit diagram illustrating an example of a pixel included in the display device of FIG. 3.

FIG. 4 shows a pixel PX located on an i-th horizontal line (or an i-th pixel row), and connected to a j-th data line Dj, for convenience of description, where i and j may be natural numbers.

Referring to FIG. 4, the pixel PX includes a light-emitting element LD and a pixel circuit that outputs a driving current to the light-emitting element LD. The pixel circuit may include first to fourth transistors T1, T2, T3, and T4 and first and second capacitors Cst and Cswp.

In one or more embodiments, a first electrode (for example, an anode electrode) of the light-emitting element LD may be connected to a first node N1, and a second electrode (for example, a cathode electrode) of the light-emitting element LD may be connected to the second power source line PL2 for transmitting the second power source voltage VSS. The light-emitting element LD may generate light having a luminance (e.g., predetermined luminance) in response to the amount of current supplied from the first transistor T1.

In one or more embodiments, the second power source line PL2 may have a line shape, but the present disclosure is not limited thereto. For example, the second power source line PL2 may be a conductive layer in the form of a conductive plate.

Meanwhile, although FIG. 4 shows the pixel PX including a single light-emitting element LD, in one or more other embodiments, the pixel PX may include a plurality of light-emitting elements, and the plurality of light-emitting elements may be connected in series, in parallel, or in series and in parallel. For example, the light-emitting element LD may have a form in which a plurality of light-emitting elements are connected in series, in parallel, or in series and in parallel between the second power source line PL2 and the first node N1.

In one or more embodiments, as shown in FIG. 4, the first transistor T1 may be an n-type MOSFET. The second to fourth transistors T2 to T4 may also be n-type MOSFETs.

Hereinafter, as shown in FIG. 4, one or more embodiments in which the transistors T1 to T4 of the pixel PX are n-type MOSFETs will be described. In another example, the third transistor T3 and the fourth transistor T4 may be p-type MOSFETs, and thus the connection relationship of the pixel circuit may be changed.

In one or more embodiments, the first transistor T1 may be connected to the light-emitting element LD to output the driving current to the light-emitting element LD. The driving current may be determined according to a magnitude of a voltage applied between a gate and a source of the first transistor T1.

In one or more embodiments, a first electrode of the first transistor T1 (or driving transistor) may be connected to the first power source line PL1, and a second electrode of the first transistor T1 may be connected to the first node N1. A gate electrode of the first transistor T1 may be connected to a third node N3. The first transistor T1 may control a driving current flowing from the first power source line PL1 providing the first power source voltage VDD through the light-emitting element LD to the second power source line PL2 providing the second power source voltage VSS in response to a voltage of the third node N3. For example, the first power source voltage VDD may be set to a higher voltage than the second power source voltage VSS.

In one or more embodiments, the second transistor T2 may be connected between the reference voltage line RL and the third node N3. A gate electrode of the second transistor T2 may be connected to a second node N2. The second transistor T2 may provide the reference voltage Vref from the reference voltage line RL to the third node N3 (or the gate electrode of the first transistor T1) in response to a voltage of the second node N2.

In one or more embodiments, the third transistor T3 may be connected between the data line Dj and the second node N2. A gate electrode of the third transistor T3 may be connected to an i-th first scan line S1i (hereinafter, referred to as a first scan line). The third transistor T3 may be turned on when the first scan signal is supplied, and the grayscale voltage Data_grey may be provided from the data line Dj to the second node N2.

In one or more embodiments, the second transistor T2 may be turned on by the grayscale voltage Data_grey, and the reference voltage Vref may be provided to the third node N3 (or the gate electrode of the first transistor T1).

In one or more embodiments, the fourth transistor T4 may be connected between the sensing line SSL and the first node N1. A gate electrode of the fourth transistor T4 may be connected to an i-th second scan line S2i (hereinafter, referred to as a second scan line). The fourth transistor T4 may be turned on when the second scan signal is supplied, and the sensing voltage Vs may be provided to the first node N1. The first node N1 may be initialized with the sensing voltage Vs.

In one or more embodiments, the first capacitor Cst may have a first electrode connected to the gate of the first transistor T1, and a second electrode connected to the source of the first transistor T1. The first capacitor Cst may store a voltage corresponding to a difference between the reference voltage Vref, which is transmitted by the second transistor T2, and the sensing voltage Vs provided by the fourth transistor T4. Because the first capacitor Cst is connected between the gate and the source of the first transistor T1, the first transistor T1 may output the driving current having a magnitude determined based on the voltage stored in the first capacitor Cst to the light-emitting element LD.

In one or more embodiments, the second capacitor Cswp may have a first electrode, which is connected to the sweep voltage line VL, and a second electrode connected to the gate of the second transistor T2. The second capacitor Cswp may store the grayscale voltage Data_grey transmitted by the third transistor T3 in response to a first scan signal S1i, and a voltage of the second node N2 may be linearly increased by the sweep voltage Vswep that changes linearly during an emission period. When the voltage of the second node N2 that is linearly increased becomes higher than a threshold voltage of the second transistor T2, the second transistor T2 may be turned on, and the reference voltage Vref may be applied to the gate of the first transistor T1, so that the first transistor T1 may be turned off.

In one or more embodiments, when the grayscale voltage Data_grey is low, a time point at which the voltage of the second node N2 becomes higher than the threshold voltage of the second transistor T2 may be delayed. Also, because the first transistor T1 may be turned off late, or slowly, an emission time of the light-emitting element LD may be increased. Conversely, when the grayscale voltage Data_grey is high, the voltage of the second node N2 may relatively quickly become higher than the threshold voltage of the second transistor T2. Also, because the first transistor T1 is quickly turned off, the emission time of the light-emitting element LD may be reduced. In this way, grayscale can be expressed by controlling the emission time of the light-emitting element LD based on the grayscale voltage Data_grey and the sweep voltage Vswep.

In one or more embodiments, the sweep voltage Vswep may be provided to the second node N2 while linearly changing from a first voltage level, which is a low level, to a second voltage level, which is a high level, during a period (e.g., predetermined period). The sweep voltage Vswep may be nonlinearly reduced from the second voltage level during a period other than the period (e.g., predetermined period), and may be provided to the second node N2 as a third voltage level, which is an intermediate level, and may be nonlinearly reduced from the third voltage level and provided to the second node N2 as the first voltage level.

In one or more embodiments, when the sweep voltage Vswep provided to the second node N2 is changed from the second voltage level to the third voltage level, the emission time of the light-emitting element LD may be controlled according to the grayscale voltage Data_grey and a difference between the second voltage level and the third voltage level.

Figure 5:
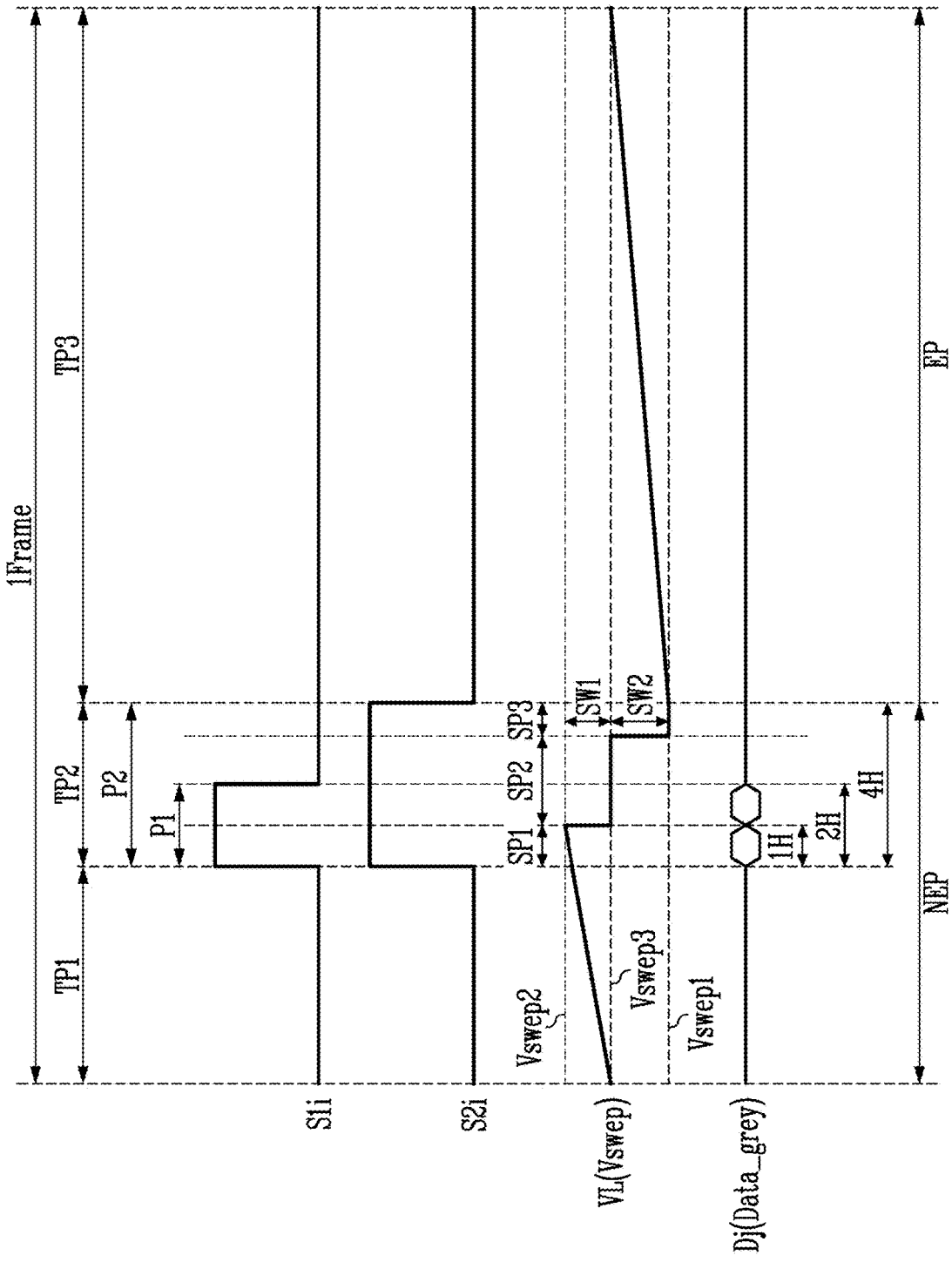
FIG. 5 is a timing diagram illustrating an example of signals supplied to the pixel of FIG. 4 during one frame.

FIG. 5 is a timing diagram illustrating an example of signals supplied to the pixel of FIG. 4 during one frame.

In one or more embodiments, one frame period may include a first driving period TP1, a second driving period TP2, and a third driving period TP3. In one example, the first driving period TP1 and the second driving period TP2 may include a non-emission period NEP. The third driving period TP3 may include an emission period EP.

In one or more embodiments, the non-emission period NEP may refer to a period in which a path of the driving current flowing from the first power source line PL1 to the second power source line PL2 through the light-emitting element LD is blocked. The emission period EP may refer to a period in which the path of the driving current is formed such that the light-emitting element LD emits light based on the driving current.

In one or more embodiments, the first driving period TP1 and the third driving period TP3 may refer to periods in which the sweep voltage Vswep linearly changes from a first voltage level Vswep1, which is a low level, to a second voltage level Vswep2, which is a high level.

In one or more embodiments, the first driving period TP1 and the third driving period TP3 may be periods in which the first scan signal S1i and a second scan signal S2i are maintained at a low level (or gate-off level).

In one or more embodiments, the second driving period TP2 may include a period in which the sweep voltage Vswep nonlinearly transitions from the second voltage level Vswep2 to a third voltage level Vswep3, and a period in which the sweep voltage Vswep nonlinearly transitions from the third voltage level Vswep3 to the first voltage level Vswep1.

In one or more embodiments, the second driving period TP2 may include a voltage writing period P1 and an initialization period P2.

In one or more embodiments, the voltage writing period P1 may be a period in which the first scan signal S1i is maintained at a high level (or gate-on level). The third transistor (for example, the third transistor T3 of FIG. 4) may be turned on by supplying the first scan signal S1i. The grayscale voltage Data_grey may be applied to the data line DL. The grayscale voltage Data_grey may be applied to the second node N2 through the third transistor T3. In one example, the grayscale voltage Data_grey may be a value that is set according to grayscale data between about −5.5V and about −1V.

In one or more embodiments, the grayscale voltage Data_grey may have a higher voltage level as a grayscale value of the grayscale data decreases, and the grayscale voltage Data_grey may have a lower voltage level as a grayscale value of the grayscale data increases. The grayscale voltage Data_grey may be charged in the second capacitor Cwep.

In one or more embodiments, during the voltage writing period P1, the second transistor T2 may be turned on as the grayscale voltage Data_grey (for example, about −5.5V to about −1V), and the sweep voltage Vswep linearly increasing from the first voltage level Vswep1 (for example, about 1V) to the second voltage level (for example, about 7V), are applied to the second node N2. In one example, a current path from the reference voltage line RL to the third node N3 through the second transistor T2 may be formed, and the reference voltage Vref (for example, about −6V) may be supplied to the third node N3. The reference voltage Vref may be supplied to the gate electrode of the first transistor T1.

In one or more embodiments, the initialization period P2 may be a period in which the second scan signal S2i is maintained at a high level (or gate-on level). The fourth transistor (for example, the fourth transistor T4 of FIG. 4) may be turned on by supplying the second scan signal S2i. The sensing voltage Vs (for example, about −12V) may be applied to the sensing line SSL. The sensing voltage Vs may be applied to the first node N1 through the fourth transistor T4. The first node N1 (or the first electrode of the light-emitting element LD) may be initialized with the sensing voltage Vs.

In one or more embodiments, when the sensing voltage Vs supplied to the first node N1 (or the first electrode of the light-emitting element LD) is higher than a standard (e.g., predetermined standard), a voltage of a parasitic capacitor of the light-emitting element LD may not be discharged, but rather may be charged. Accordingly, the sensing voltage Vs (for example, about −12V) that is lower than the second power source voltage VSS (for example, about 0V) may be suitable.

In one or more embodiments, during the voltage writing period P1, the reference voltage Vref may be applied to the third node N3 as the second transistor T2 and the third transistor T3 are turned on.

In one or more embodiments, during the initialization period P2, the first node N1 may be initialized with the sensing voltage Vs as the fourth transistor T4 is turned on.

In one or more embodiments, a driving circuit may control a magnitude of the driving current based on the reference voltage Vref. The sensing voltage Vs, which is for maintaining the magnitude of the driving current at a level (e.g., predetermined level) based on the reference voltage Vref, may be applied between the gate and the source of the first transistor T1.

In one or more embodiments, at least a part of the initialization period P2 may overlap the voltage writing period P1. In one example, the length of the initialization period P2 may be longer than the length of the voltage writing period P1. For example, the voltage writing period P1 may be set to 2 horizontal periods 2H, and the initialization period P2 may be set to 4 horizontal periods 4H. The second scan signal S2i may overlap the first scan signal S1i in 2 horizontal periods 2H.

In one or more embodiments, when the voltage writing period P1 is set to 2 horizontal periods, the first scan signal supplied to an (i−1)th first scan line S1i−1 may overlap the scan signal supplied to the i-th first scan line S1i in 1 horizontal period 1H.

However, this is only an example, and the lengths of the voltage writing period P1 and the initialization period P2 are not limited thereto, and may be designed and modified in various ways according to driving conditions or the like.

In one or more embodiments, the voltage writing period P1 may include a first transition period SP1 in which the sweep voltage Vswep transitions from the second voltage level Vswep2, which is the high level, to the third voltage level Vswep3, which is the intermediate level. In one example, the third voltage level Vswep3 may be a voltage value between the first voltage level Vswep1 and the second voltage level Vswep2. In one example, as the sweep voltage Vswep transitions to the third voltage level Vswep3, a voltage applied to the second node N2 may also decrease by a voltage (hereinafter, a first transition voltage SW1) reduced from the second voltage level Vswep2 to the third voltage level Vswep3. Even when the sweep voltage Vswep transitions from the second voltage level Vswep2 to the third voltage level Vswep3, because the voltage of the gate of the second transistor T2, that is, the second node N2, is higher than the reference voltage Vref, the second transistor T2 may be turned on.

In one or more embodiments, after the sweep voltage Vswep nonlinearly transitions from the second voltage level Vswep2 to the third voltage level Vswep3, the voltage write period P1 may include a holding period SP2 in which the sweep voltage Vswep is maintained at the third voltage level Vswep3.

In one or more embodiments, the turn-on timing of the second transistor T2 may be determined according to the grayscale voltage Data_grey, the first transition voltage SW1, and the threshold voltage of the second transistor T2. In one or more embodiments, the second transistor T2 of the driving circuit may control a pulse width of the driving current based on the grayscale voltage Data_grey. The driving circuit may control the emission time of the light-emitting element LD based on the sweep voltage Vswep and the grayscale voltage Data_grey.

In one or more embodiments, the initialization period P2 may include a period in which the supply of the first scan signal S1i is stopped and the second scan signal S2i is supplied. In the initialization period P2 that does not overlap with the voltage writing period P1, the sweep voltage Vswep may include a second transition period SP2 transitioning from the third voltage level Vswep3 to the first voltage level Vswep1. Because the sweep voltage Vswep transitions from the third voltage level Vswep3 to the first voltage level Vswep1 (for example, about 1V), and because the first scan signal S1i is not supplied, the voltage applied to the second node N2 may decrease by a voltage (hereinafter referred to as a first transition voltage SW2) to be reduced from the third voltage level Vswep3 to the first voltage level Vswep1. That is, a gate-source voltage of the second transistor T2 may be lower than the threshold voltage of the second transistor T2, and the second transistor T2 may be turned off.

In one or more embodiments, during the initialization period P2, the second transition period SP2 may include a period in which the sweep voltage Vswep is maintained at the first voltage level Vswep1.

In one or more embodiments, during the third driving period TP3, the supply of the second scan signal S2i is stopped so that the fourth transistor T4 may be turned off, and the first transistor T1 may be turned on as a gate-source voltage of the first transistor T1 becomes higher than the threshold voltage of the transistor T1. In addition, a current path may be formed by a voltage difference between the first power source voltage VDD (for example, about 8V) and the second power source voltage VSS (for example, about 0V), so that the first transistor T1 may output a driving current corresponding to the voltage stored in the first capacitor Cst, and the light-emitting element LD may start emitting light with a luminance corresponding to the driving current.

In one or more embodiments, during the third driving period TP3, as the supply of the second scan signal S2i is stopped, a voltage applied to the first node N1 may increase. Also, as the voltage applied to the first node N1 increases, a voltage applied to the third node N3 connected to the gate electrode of the first transistor T1 may also increase. Accordingly, as the gate-source voltage of the first transistor T1 becomes a positive voltage, the first transistor T1 may be turned on.

In one or more embodiments, during the third driving period TP3, the sweep voltage Vswep may linearly increase from the first voltage level Vswep1 (for example, about 1V). Accordingly, the voltage of the second node N2, that is, the gate electrode of the second transistor T2 may also linearly increase. The gate-source voltage of the second transistor T2, which is a difference between the voltage of the second node N2 and the reference voltage Vref, may gradually increase. When the gate-source voltage of the second transistor T2 becomes higher than the threshold voltage of the second transistor T2, the emission period EP (or the third driving period TP3) may end, and the non-emission period NEP (or the first driving period TP1) may begin. When the gate-source voltage of the second transistor T2 becomes higher than the threshold voltage of the second transistor T2, the second transistor T2 may be turned on.

In one or more embodiments, as the reference voltage Vref (for example, about −6V) is applied to the gate electrode of the first transistor T1 through the second transistor T2, voltages applied to the first node N1 and the second node N3 may also decrease, so that the gate-source voltage of the first transistor T1 may become a negative voltage. Thus, the first transistor T1 may be turned off.

Figure 6A:
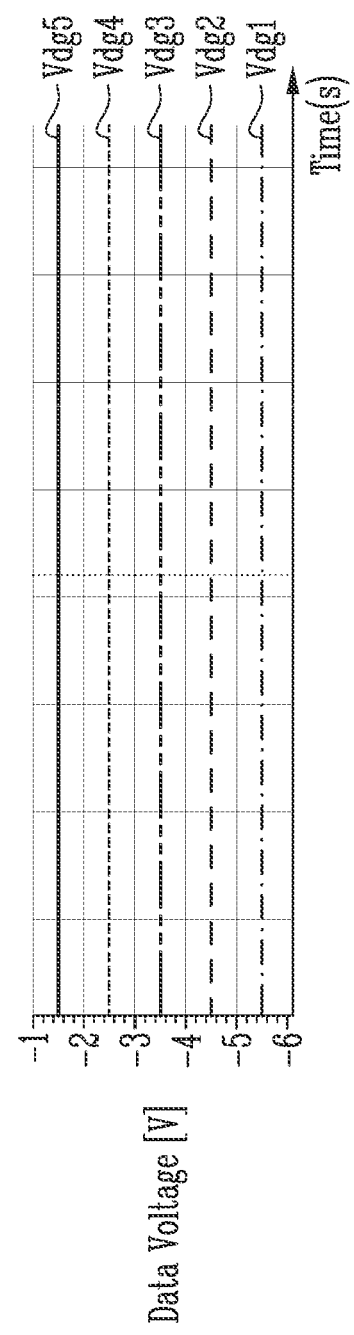

FIGS. 6A and 6B are diagrams illustrating an emission period of the light-emitting element according to a grayscale voltage of FIG. 4.

Referring to FIGS. 6A and 6B, the emission period according to a magnitude of the grayscale voltage (for example, the grayscale voltage Data_grey of FIG. 5) is shown. First to fifth grayscale voltages Vdg1, Vdg2, Vdg3, Vdg4, and Vdg5 corresponding to first to fifth data grayscale values, in which data grayscale values are sequentially decreased, are shown. As the data grayscale value is smaller, the grayscale voltage Data_grey may have a higher voltage level. The lower the grayscale voltage Data_grey, the longer the period in which the second transistor T2 is turned off, and thus, the longer the emission period (for example, the emission period EP of FIG. 5). For example, the emission period corresponding to the first grayscale voltage Vdg1 may be longer than the emission period corresponding to the fifth grayscale voltage Vdg5.

Figure 7A:
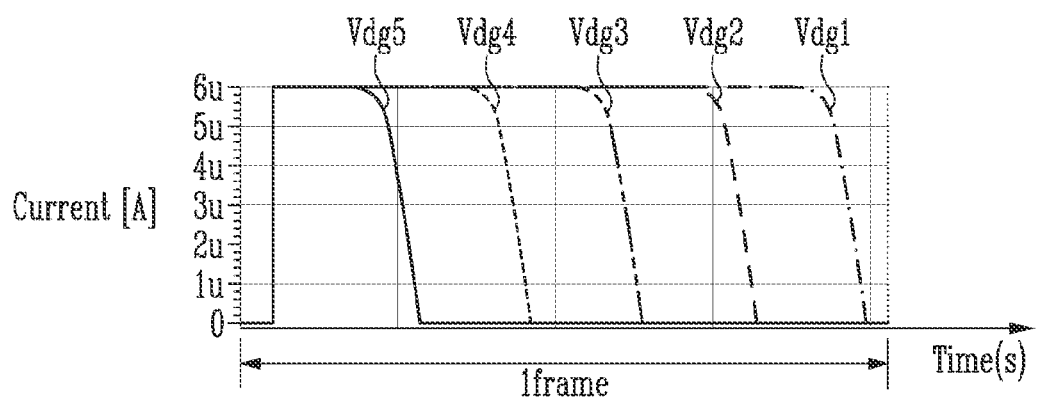
FIGS. 7A to 7C are diagrams illustrating an emission period of the light-emitting element according to a control signal provided to a sweep voltage line of FIG. 4.
Figure 7B:
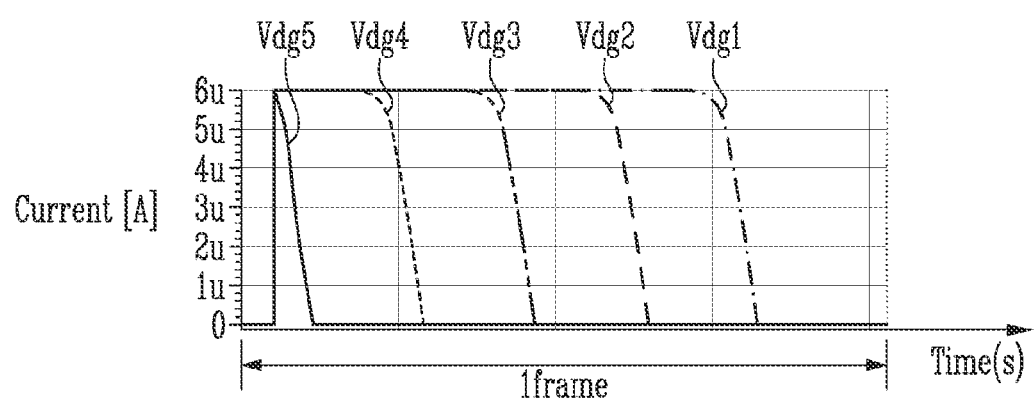
Figure 7C:
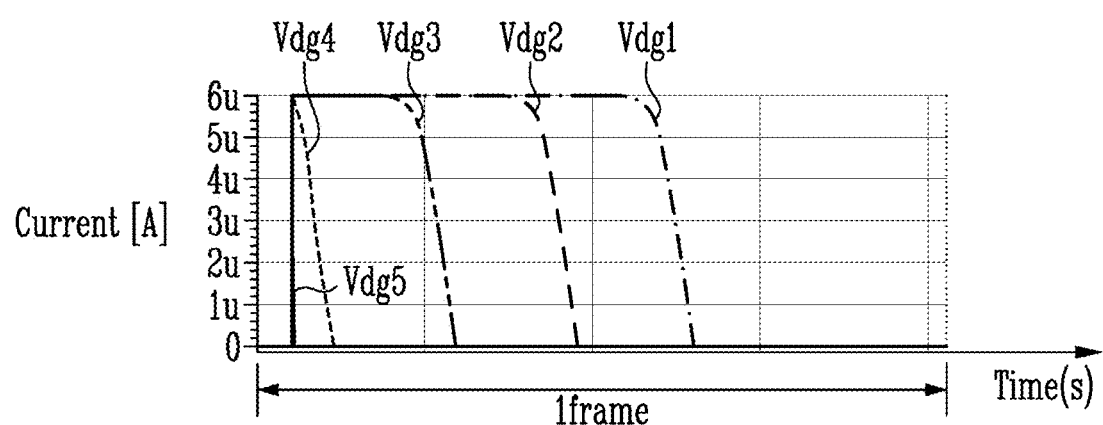

FIGS. 7A to 7C are diagrams illustrating an emission period of the light-emitting element according to a control signal provided to a sweep voltage line of FIG. 4.

Referring to FIGS. 7A to 7C, in the first transition period (for example, the first transition period SP1 of FIG. 5) in which the sweep voltage Vswep provided by the sweep voltage line (for example, the sweep voltage line VL of FIG. 4) transitions, the emission time of the light-emitting element according to the third voltage level Vswep3, which is a voltage that nonlinearly transitions from the second voltage level Vswep2, is shown.

Referring to FIGS. 7A and 7B, for the same grayscale voltage (for example, the grayscale voltage Data_grey of FIG. 5), the higher the transition voltage (for example, the first transition voltage SW1 of FIG. 5) at the second voltage level Vswep2, which is the high level (e.g., the lower the third voltage level Vswep3), the higher the voltage of the second node N2 may be. For the same grayscale voltage, as the first transition voltage SW1 increases, the voltage applied to the second node N2 may increase, and may become higher than the threshold voltage of the second transistor T2. Also, the first transistor may be turned off relatively quickly, and the emission time of the light-emitting element may be shortened. Because the first transition voltage SW1 of FIG. 7A is less than the first transition voltage SW1 of FIG. 7B, the emission time of the light-emitting element of FIG. 7A may be relatively long. Because the first transition voltage SW1 of FIG. 7B is less than the first transition voltage SW1 of FIG. 7C, the emission time of the light-emitting element of FIG. 7B may be relatively long.

FIG. 8 is a timing diagram illustrating an example of signals supplied to the pixel of FIG. 4 during one frame.

The timing diagram of FIG. 8 may be the same as the operation of the pixel PX described with reference to FIG. 5, except for the operation of the sweep voltage Vswep supplied by the sweep voltage line VL of FIG. 5. Therefore, the same reference numerals are used for the same or corresponding components, and duplicate descriptions thereof will be omitted.

The timing diagram of FIG. 8 shows the operation of the pixel circuit without adjusting the emission period of the light-emitting element according to the transition of the sweep voltage Vswep, that is, adjusting the brightness of the light-emitting element.

In one or more embodiments, one frame period may include a first driving period TP1', a second driving period TP2', and a third driving period TP3'. In one example, the first driving period TP1' and the second driving period TP2' may include a non-emission period NEP. The third driving period TP3' may include an emission period EP.

In one or more embodiments, the first driving period TP1' and the third driving period TP3' may refer to periods in which the sweep voltage Vswep linearly changes from the first voltage level Vswep1, which is the low level, to the second voltage level Vswep2, which is the high level.

In one or more embodiments, the second driving period TP2' may include a period in which the sweep voltage Vswep nonlinearly transitions from the second voltage level Vswep2, which is the high level, to the first voltage level Vswep1, which is the low level.

In one or more embodiments, the second driving period TP2' may include a voltage writing period P1' and an initialization period P2'.

In one or more embodiments, the voltage writing period P1' may be a period in which the first scan signal S1i is maintained at a high level (or gate-on level). The third transistor (for example, the third transistor T3 of FIG. 4) may be turned on by supplying the first scan signal S1i. The grayscale voltage Data_grey may be applied to the data line DL.

In one or more embodiments, in the voltage writing period P1', as the grayscale voltage Data_grey (for example, about −5.5V to about −1V) and the sweep voltage Vswep that linearly increases from the first voltage level Vswep1 (for example, about 1V) to the second voltage level Vswep2 (for example, about 7V) are applied to the second node N2, the third transistor T3 may be turned on. In one or more embodiments, a current path from the reference voltage line RL to the third node N3 through the second transistor T2 may be formed, and the reference voltage Vref (for example, about −6V) may be supplied to the third node N3. The reference voltage Vref may be supplied to the gate electrode of the first transistor T1.

In one or more embodiments, the initialization period P2' may be a period in which the second scan signal S2i is maintained at a high level (or gate-on level). The fourth transistor (for example, the fourth transistor T4 of FIG. 4) may be turned on by supplying the second scan signal S2i. The sensing voltage Vs (for example, about −12V) may be applied to the sensing line SSL. The sensing voltage Vs may be applied to the first node N1 through the fourth transistor T4. The first node N1 (or the first electrode of the light-emitting element LD) may be initialized with the sensing voltage Vs.

In one or more embodiments, at least a part of the initialization period P2' may overlap the voltage writing period P1'. In one example, the length of the initialization period P2' may be longer than the length of the voltage writing period P1'.

In one or more embodiments, the voltage writing period P1' may include a period in which the sweep voltage Vswep nonlinearly transitions from the second voltage level Vswep2, which is the high level, to the first voltage level Vswep1, which is the low level.

In one or more embodiments, as the sweep voltage Vswep transitions from the second voltage level Vswep2 to the first voltage level Vswep1, the voltage applied to the second node (for example, the second node N2 of FIG. 4) may decrease by a transition voltage SW' that is a voltage reduced from the second voltage level Vswep2 to the first voltage level Vswep1. The transition voltage SW' may be a voltage value corresponding to a difference between the second voltage level Vswep2 and the first voltage level Vswep1.

In one or more embodiments, as the sweep voltage Vswep transitions from the second voltage level Vswep2 to the first voltage level Vswep1, the voltage applied to the second node N2 may decrease so that the gate-source voltage of the second transistor T2 may be lower than the threshold voltage of the second transistor T2, and the second transistor T2 may be turned off.

In one or more embodiments, in the third driving period TP3', the sweep voltage Vswep may linearly increase from the first voltage level Vswep1 (for example, about 1V). Accordingly, the voltage of the second node N2, that is, the gate electrode of the second transistor T2, may also linearly increase. The gate-source voltage of the second transistor T2, which is a difference between the voltage of the second node N2 and the reference voltage Vref, may gradually increase. When the gate-source voltage of the second transistor T2 becomes higher than the threshold voltage of the second transistor T2, the emission period EP (or the third driving period TP3') may end, and the non-emission period NEP (or the first driving period TP1') may begin. When the gate-source voltage of the second transistor T2 becomes higher than the threshold voltage of the second transistor T2, the second transistor T2 may be turned on. The turned-on second transistor T2 may apply the reference voltage Vref to the gate electrode of the first transistor T1, and the first transistor T1 may be turned off.

The pixel and the display device including the same according to the embodiments of the present disclosure may provide excellent display quality and a screen having a relatively high resolution.

However, effects of the present disclosure are not limited to the above-described effects, and may be variously extended without departing from the spirit and scope of the present disclosure.

As described above, preferred embodiments of the present disclosure have been described with reference to the drawings. However, those skilled in the art will appreciate that various modifications and changes can be made to the present disclosure without departing from the spirit and scope of the present disclosure as set forth in the appended claims, with functional equivalents thereof to be included therein.

What is claimed is:

1. A pixel comprising:
a light-emitting element;
a first transistor connected between a first power source line, which is configured to provide a first power source voltage, and a first node, and configured to generate a drive current flowing from the first power source line to a second power source line, which is configured to provide a second power source voltage, through the light-emitting element;
a second transistor connected between a third power source line, which is configured to provide a reference voltage, and a gate electrode of the first transistor;
a third transistor connected between a data line, which is configured to provide a grayscale voltage, and a gate electrode of the second transistor, and configured to be turned on in response to a first scan signal;
a fourth transistor connected between a fourth power source line, which is configured to provide a sensing voltage, and the first node, and configured to be turned on in response to a second scan signal;
a first capacitor between the gate electrode of the first transistor and the first node; and
a second capacitor between the gate electrode of the second transistor and a sweep voltage line, which is configured to provide a sweep voltage that linearly changes from a first voltage level to a second voltage level in response to a control signal, and that nonlinearly changes from the second voltage level to a third voltage level during a period in which the grayscale voltage is provided by the third transistor to the gate electrode of the second transistor.

2. The pixel of claim 1, wherein the third voltage level is between the first voltage level and the second voltage level.

3. The pixel of claim 2, wherein an emission time of the light-emitting element corresponds to the grayscale voltage and the third voltage level.

4. The pixel of claim 3, wherein the emission time of the light-emitting element increases as a level of the grayscale voltage decreases.

5. The pixel of claim 3, wherein the emission time of the light-emitting element decreases as the third voltage level decreases.

6. The pixel of claim 1, wherein the sweep voltage line is configured to provide the sweep voltage that nonlinearly changes to the first voltage level from the third voltage level during a period in which the fourth transistor is turned on.

7. The pixel of claim 6, wherein the sweep voltage line is configured to provide the sweep voltage that nonlinearly changes to the first voltage level from the third voltage level during a period in which the third transistor is turned off.

8. The pixel of claim 1, wherein the first node is configured to be electrically connected to the second power source line.

9. The pixel of claim 1, wherein the light-emitting element is configured to emit green light.

10. A pixel comprising:
a light-emitting element;
a first transistor connected between a first power source line, which is configured to provide a first power source voltage, and a first node, and configured to generate a drive current flowing from the first power source line to a second power source line, which is configured to provide a second power source voltage, through the light-emitting element;
a second transistor connected between a third power source line, which is configured to provide a reference voltage, and a gate electrode of the first transistor;
a third transistor connected between a data line, which is configured to provide a grayscale voltage, and a gate electrode of the second transistor, and configured to be turned on in response to a first scan signal;
a fourth transistor connected between a fourth power source line, which is configured to provide a sensing voltage, and the first node, and configured to be turned on in response to a second scan signal;
a first capacitor between the gate electrode of the first transistor and the first node; and
a second capacitor between the gate electrode of the second transistor and a sweep voltage line, which is configured to provide a sweep voltage that linearly changes from a first voltage level to a second voltage level in response to a control signal, and that nonlinearly changes from the second voltage level to a third voltage level during a period in which the third transistor is turned on,
wherein one frame period comprises:
a first period during which the first scan signal is supplied to the third transistor, and the grayscale voltage supplied to the data line is written to a second node connected to the gate electrode of the second transistor; and a second period during which the second scan signal is supplied to the fourth transistor, and the sensing voltage supplied to the fourth power source line is written to the first node, and wherein the second period at least partially overlaps the first period.

11. The pixel of claim 10, wherein, during the first period, the third transistor is configured to be turned on, and the reference voltage supplied to the third power source line is configured to be written to a third node connected to the gate electrode of the first transistor.

12. The pixel of claim 10, wherein the second period is twice as long in duration as the first period.

13. The pixel of claim 10, wherein the one frame period further comprises a third period for providing the sweep voltage that linearly changes from the first voltage level to the second voltage level.

14. The pixel of claim 13, wherein the second transistor and the third transistor are configured to be turned off during the third period.

15. A display device comprising:
a pixel connected to a first scan line and a second scan line, a data line, and a sweep voltage line;
a scan driver configured to supply a first scan signal and a second scan signal to the first scan line and the second scan line, respectively; and
a data driver configured to supply a data grayscale signal to the data line,
wherein the pixel comprises:
a first transistor connected between a first power source line, which is configured to provide a first power source voltage, and a first node, and configured to generate a drive current flowing from the first power source line to a second power source line, which is configured to provide a second power source voltage, through a light-emitting element;
a second transistor connected between a third power source line, which is configured to provide a reference voltage, and a gate electrode of the first transistor;
a third transistor connected between the data line and a gate electrode of the second transistor, and configured to be turned on in response to the first scan signal;

a fourth transistor connected between a fourth power source line, which is configured to provide a sensing voltage, and the first node, and configured to be turned on in response to the second scan signal;
a first capacitor between the gate electrode of the first transistor and the first node; and
a second capacitor between the gate electrode of the second transistor and the sweep voltage line, which is configured to provide a sweep voltage that linearly changes from a first voltage level to a second voltage level in response to a control signal, and that nonlinearly decreases from the second voltage level to a third voltage level during a period in which grayscale voltage is provided by the third transistor to the gate electrode of the second transistor.

16. The display device of claim 15, wherein the third voltage level is between the first voltage level and the second voltage level.

17. The display device of claim 16, wherein one frame period comprises:
a first period during which the first scan signal is supplied to the third transistor, and a grayscale voltage supplied to the data line is written to a second node connected to the gate electrode of the second transistor; and
a second period at least partially overlaps the first period, and during which the second scan signal is supplied to the fourth transistor, and the sensing voltage supplied to the fourth power source line is written to the first node.

18. The display device of claim 17, wherein, during the first period, the third transistor is turned on, and the reference voltage supplied to the third power source line is written to a third node connected to the gate electrode of the first transistor.

19. The display device of claim 17, wherein, during a period in which the third transistor is turned off and the fourth transistor is turned on, the sweep voltage line provides the sweep voltage that nonlinearly decreases from the third voltage level to the first voltage level.

20. The display device of claim 17, wherein the one frame period further comprises a third period for providing the sweep voltage that linearly changes from the first voltage level to the second voltage level, and during which the second transistor and the third transistor are turned off.

* * * * *